US009054307B2

(12) United States Patent
Wang et al.

(10) Patent No.: US 9,054,307 B2
(45) Date of Patent: *Jun. 9, 2015

(54) RESISTIVE RANDOM ACCESS MEMORY CELLS HAVING METAL ALLOY CURRENT LIMITING LAYERS

(71) Applicants: Intermolecular Inc., San Jose, CA (US); Kabushiki Kaisha Toshiba, Tokyo (JP); SanDisk 3D LLC, Milpitas, CA (US)

(72) Inventors: Yun Wang, San Jose, CA (US); Tony P. Chiang, Campbell, CA (US); Imran Hashim, Saratoga, CA (US); Tim Minvielle, San Jose, CA (US); Dipankar Pramanik, Saratoga, CA (US); Takeshi Yamaguchi, Kanagawa (JP)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/317,155

(22) Filed: Jun. 27, 2014

(65) Prior Publication Data

US 2014/0315369 A1    Oct. 23, 2014

Related U.S. Application Data

(63) Continuation of application No. 13/722,314, filed on Dec. 20, 2012, now Pat. No. 8,817,524, which is a continuation-in-part of application No. 13/353,000, filed on Jan. 18, 2012, now Pat. No. 8,681,530.

(60) Provisional application No. 61/513,355, filed on Jul. 29, 2011.

(51) Int. Cl.
*G11C 13/00* (2006.01)
*G11C 7/00* (2006.01)
(Continued)

(52) U.S. Cl.
CPC .......... *H01L 45/1608* (2013.01); *H01L 45/145* (2013.01); *G11C 13/0007* (2013.01);
(Continued)

(58) Field of Classification Search
CPC ........... G11C 13/0002; G11C 13/0004; H01L 45/1233; H01L 45/146; H01L 45/06; H01L 45/1253; H01L 27/2463; H01L 45/04
USPC ................... 365/148, 163; 257/2, E21.004, 5
See application file for complete search history.

(56) References Cited

U.S. PATENT DOCUMENTS

| | | | | |
|---|---|---|---|---|
| 5,886,460 | A * | 3/1999 | Jones et al. | 313/310 |
| 8,817,524 | B2 * | 8/2014 | Wang et al. | 365/148 |
| 2009/0086521 | A1 * | 4/2009 | Herner et al. | 365/63 |

*Primary Examiner* — Ly D Pham

(57) ABSTRACT

Provided are semiconductor devices, such as resistive random access memory (ReRAM) cells, that include current limiting layers formed from alloys of transition metals. Some examples of such alloys include chromium containing alloys that may also include nickel, aluminum, and/or silicon. Other examples include tantalum and/or titanium containing alloys that may also include a combination of silicon and carbon or a combination of aluminum and nitrogen. These current limiting layers may have resistivities of at least about 1 Ohm-cm. This resistivity level is maintained even when the layers are subjected to strong electrical fields and/or high temperature processing. In some embodiments, the breakdown voltage of a current limiting layer is at least about 8V. The high resistivity of the layers allows scaling down the size of the semiconductor devices including these layers while maintaining their performance.

20 Claims, 5 Drawing Sheets

(51) Int. Cl.
*H01L 45/00* (2006.01)
*H01L 27/24* (2006.01)

(52) U.S. Cl.
CPC .............. *G11C13/003* (2013.01); *H01L 45/08* (2013.01); *H01L 45/12* (2013.01); *H01L 45/1233* (2013.01); *H01L 45/146* (2013.01); *H01L 27/2409* (2013.01); *G11C 2213/56* (2013.01); *G11C 2213/76* (2013.01); *G11C 13/0002* (2013.01); *G11C 13/0004* (2013.01); *H01L 27/2463* (2013.01); *H01L 45/04* (2013.01); *H01L 45/1253* (2013.01); *H01L 45/16* (2013.01)

RESISTIVE RANDOM ACCESS MEMORY CELLS HAVING METAL ALLOY CURRENT LIMITING LAYERS

CROSS-REFERENCE TO RELATED APPLICATIONS

This is a Continuation Application of U.S. patent application Ser. No. 13/722,314, filed on Dec. 20, 2012, which is a continuation-in-part of U.S. patent application Ser. No. 13/353,000, filed on Jan. 18, 2012, which claims priority to U.S. Provisional Patent Application No. 61/513,355, filed Jul. 29, 2011. Each of these applications is incorporated herein in their entireties by reference for all purposes.

TECHNICAL FIELD

The present invention relates generally to semiconductor devices and more specifically to resistive random access memory (ReRAM) cells having metal alloy current limiting layers.

BACKGROUND

Nonvolatile memory is computer memory capable of retaining stored information even when unpowered. Nonvolatile memory is typically used for the task of secondary storage or long-term persistent storage and may be used in addition to volatile memory, which loses stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in some computer systems. However, transistor-based flash memory is often inadequate to meet the requirements of various applications. New types of memory, such as resistive random access memory (ReRAM), are being developed to meet these demands and requirements.

SUMMARY

Provided are semiconductor devices, such as resistive random access memory (ReRAM) cells, that include current limiting layers formed from alloys of transition metals. Some examples of such alloys include chromium containing alloys that may also include nickel, aluminum, and/or silicon. Other examples include tantalum and/or titanium containing alloys that may also include a combination of silicon and carbon or a combination of aluminum and nitrogen. These current limiting layers may have resistivities of at least about 1 Ohm-cm. This resistivity level is maintained even when the layers are subjected to strong electrical fields and/or high temperature processing. In some embodiments, the breakdown voltage of a current limiting layer is at least about 8V. The high resistivity of the layers allows scaling of the size of the semiconductor devices including these layers while maintaining their performance.

In some embodiments, a resistive random access memory cell includes an electrode layer, a current limiting layer, and a resistive switching layer, such that the electrode layer, the current limiting layer, and the resistive switching layer form a stack. The current limiting layer may include chromium. In some embodiments, the current limiting layer has a breakdown voltage of at least about 8V or, more specifically, of at least about 10V, and even at least about 12V. The resistivity of the current limiting layer may be at least about 1 Ohm-cm or, more specifically, at least about 5 Ohm-cm, or even at least about 10 Ohm-cm in a direction normal to the current limiting layer (along the height of the stack). The resistivity in other directions, e.g., parallel to the current limiting layer, may be different and, in some embodiments, substantially less that the above listed values. For example, the current limiting layer has a resistivity of less than 0.001 Ohm-cm in the direction parallel to the current limiting layer. In some embodiments, the current limiting layer extends across multiple resistive random access memory cells and is operable as a signal line. The resistive switching layer includes a resistive switching material.

In some embodiments, the current limiting layer includes one of NiCr, AlNiCr, SiCr, SiCrO, or SiCrWN. The concentration of chromium in the chromium containing layer may be between about 25 and 75 atomic percent or, more specifically, between about 35 and 65 atomic percent or between about 40 and 50 atomic percent. Other concentrations of chromium can be used as well, such as between about 25 and 50 atomic percent, or more specifically between about 30 and 40 atomic percent. In other embodiments, chromium concentration is between about 50 and 75 atomic percent, such as between about 60 and 70 atomic percent.

In some embodiments, the current limiting layer has a thickness of less than 200 Angstroms or, more specifically, less than about 100 Angstroms, or even less than about 50 Angstroms. The resistivity of the current limiting layer may change by less than 10% upon applying an electrical field of 1 MV/cm. In some embodiments, the current limiting layer does not change its crystallinity after being subject to a thermal anneal. The thermal anneal may be a conventional thermal anneal used for triggering diodes, e.g., 750° C. for 1 minute. The current limiting layer may be in a substantially amorphous form.

In some embodiments, the resistive switching material includes one of hafnium oxide, aluminum oxide, tantalum oxide, zirconium oxide, or yttrium oxide. The electrode layer may be formed from one of doped polysilicon, titanium, titanium nitride, platinum, iridium, iridium oxide, ruthenium, or ruthenium oxide. The resistive random access memory cell may also include a diffusion barrier layer disposed between the current limiting layer and the resistive switching layer. The diffusion barrier layer may be formed from various materials, such as TiSiN, TaSiN, and WSiN. In general, the current limiting layer may or may not contact the resistive switching layer. In some embodiments, the resistive random access memory cell includes an additional electrode disposed between the current limiting layer and the resistive switching layer.

BRIEF DESCRIPTION OF THE DRAWINGS

So that the above recited features of the present invention can be understood in detail, a more particular description of the invention, briefly summarized above, is provided with reference to embodiments, some of which are illustrated in the appended drawings. It is to be noted, however, that the appended drawings illustrate only typical embodiments of this invention and are therefore not to be considered limiting of its scope, for the invention may include other equally effective embodiments.

Figure 1:
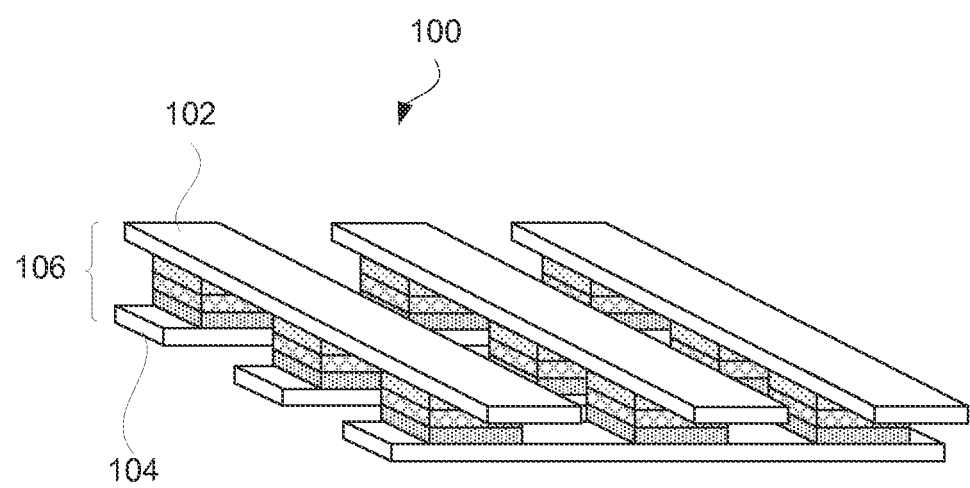
FIG. 1 illustrates a schematic representation of an array including multiple ReRAM cells, in accordance with some embodiments.

While the foregoing is directed to embodiments of the present invention, other and further embodiments of the invention may be devised without departing from the basic scope thereof, and the scope thereof is determined by the claims that follow.

DETAILED DESCRIPTION

Introduction

A ReRAM cell exhibiting resistive switching characteristics generally includes multiple layers formed into a stack. This stack is often referred to as a Metal-Insulator-Metal (MIM) stack. The stack includes two conductive layers operating as electrodes, which may include metals and other conductive materials, such as doped silicon. These conductive layers are identified as "M" in the above naming convention. The stack also includes a resistive switching layer, which is made from less conductive materials than the electrodes. As such, this layer is labeled as "I" for an insulator. This layer exhibits resistive switching properties characterized by different resistive states, which may be used to store one or more bits of information. For example, one resistive state may be used to represent a logical "zero," while another resistive state may be used to represent a logical "one." The difference in the resistive states may be attributed to changes in the insulator layer, changes at one or both interfaces between the insulator layer and metal layers, or both types of changes. The stack may also include other layers as further described above, such as a current limiting layer, a current steering layer, a barrier layer, and the like.

A current limiting layer may be provided in a ReRAM cell to limit the current through the cell and prevent unintentional damage to various layers of the cell. As a result, performance and life time of the ReRAM cell may be improved. Embedding the current limiting layer into the cell such that the current limiting layer directly interfaces the resistive switching layer or being positioned close to the resistive switching layer may be important, particularly in ReRAM cells that utilize high speed programming pulses as further discussed below. The current limiting layer may be formed from a material that does not significantly vary in resistivity when the "set" and "reset" voltages are applied to the cell, contrary to the resistive switching layer. This resistance stability assures that switching characteristics of the cell will not change over its lifetime.

Provided are semiconductor devices, such as resistive random access memory (ReRAM) cells, that include current limiting layers formed from alloys including transition metals, such chromium, titanium, tantalum, and others. Some specific examples include chromium containing materials, such as NiCr, Al—NiCr, SiCr, SiCrO, SiCr(W)N, transition metals combined with Group IV and/or Group VI elements, such as TiSiC and TaSiC, and transition metals combined with Group III and Group V elements, such as TiAlN and TaAlN. In some embodiments, a material forming a current limiting layer has a resistivity of at least about 1 Ohm-cm or, more specifically, at least about 10 Ohm-cm in a direction normal to the layer (i.e., along the height of the stack formed by the current limiting and other layers). In some embodiments, the current limiting layer material may have much lower resistivities in other directions, e.g., in the directions parallel to the layer. As such, the same component may be used as a current limiting layer and a signal line and extend across multiple ReRAM cells. The resistivity levels specified above may be maintained even when the layers are subjected to strong electrical fields and/or high temperature annealing. In some embodiments, the breakdown voltage of a current limiting layer may be at least about 8V.

These current limiting layers may be coupled with resistive switching layers formed from hafnium oxide, aluminum oxide, zirconium oxide, and other resistive switching materials. The high resistivity of the layers allows scaling down the size of the semiconductor devices including these layers while maintaining their performance.

Examples of Re-RAM Cell Operation

FIG. 1 illustrates a schematic representation of a memory array 100 including multiple ReRAM cells 106, in accordance with some embodiments. Memory array 100 may be a part of a larger memory device or other integrated circuit structure, such as a system on a chip type device. ReRAM cells 106 are connected to their control circuitry (e.g., read and write circuitry) by word lines and bit lines, which are illustrated as electrode layers 102 and 104 in FIG. 1. The word lines and bit lines may be orthogonal to form a cross-type array. Each word and bit line may be shared by multiple ReRAM cells. In some embodiments (further described below), only portions of electrode layers 102 and 104 (i.e., sub-layers) form corresponding word lines and bit lines, while the remaining portions of these layers are constrained within the boundaries of each cell.

Electrode layers 102 and 104 are used to read from or write data into ReRAM cells 106. Multiple ReRAM cells may share one electrode, but each ReRAM cell includes a unique combination of two electrodes. That is, no two ReRAM cells in array 100 share the same two electrodes. In addition to communication functions, electrode layers 102 and 104 may be used to provide resistive switching characteristics with ReRAM cells.

Electrode layers 102 and 104 include one or more conductive sub-layers. In a multilayered electrode, each layer may have a designated function and is made from specific material. For example, electrode layers 102 and 104 may each include two or more conductive sub-layers. One of these sub-layers may be used to interconnect multiple ReRAM cells 200 in the array (i.e., perform function of bit and word line), while another sub-layer may provide a desirable electrical interface (e.g., desirable work function) to a resistive switching layer. In this example, one sub-layer of the electrode layer is shared by multiple ReRAM cells, while another sub-layer is specific to each ReRAM cell.

Operation of ReRAM cells will now be described with reference to FIGS. 2 and 3. The resistive state of a ReRAM cell can be sensed by applying a sensing voltage (i.e., a "read" voltage $V_{READ}$ shown in FIG. 2) to its electrode layers or, more specifically, to a specific combination of a word and bit lines. In some embodiments, the read voltage may be about +0.5 volts (V). Depending on its history, a memory element that is addressed in this way may be in either a high resistance state (HRS) or a low resistance state (LRS). The resistance of the ReRAM cell therefore determines what digital data is being stored by the ReRAM cell. For example, of the ReRAM cell is in the HRS, for example, the memory element may be said to contain a logic "zero" (i.e., a "0" bit). If, on the other hand, the memory element is in the LRS, the memory element may be said to contain a logic "one" (i.e., a "1" bit). Of course, an opposite data assignment scheme may be used as well. That is, the HRS may correspond to the logic "one" while the LRS may correspond to the logic "zero." During a write operation, the state of a ReRAM cell can be changed by applying a suitable write signal to its electrode layers.

In some embodiments, a ReRAM cell uses bipolar switching where opposite polarity "set" and "reset" voltages are used to alter the resistance of the memory element between its HRS and LRS. FIG. 2 schematically illustrates a log-log plot of current (I) versus voltage (V) of one example of the LRS and HRS curves of a ReRAM cell having these two bi-stable resistive states. The voltage levels $V_{SET}$ and $V_{RESET}$ shown in FIG. 2, illustrate typical threshold values used to "set" and "reset" the contents of the ReRAM cell.

At some point, the ReRAM cell may be in its HRS, which can be sensed by the read and write circuitry using the cell's electrode layers. Specifically, the read and write circuitry may apply a read voltage $V_{READ}$ to the ReRAM cell and can sense the resulting "off" current ($I_{OFF}$) that flows through the cell. When it is desired to switch from one logic state into another to store a different value, the cell can be placed into its LRS. This may be accomplished by using the read and write circuitry to apply a "set" voltage $V_{SET}$ (e.g., −1 V to −4 V) across the cell's electrode layers. In some embodiments, applying a negative $V_{SET}$ voltage to the ReRAM cell causes the cell to switch to its LRS. It is believed that the change in the resistive state of the ReRAM cell may be due to the redistribution or filling of traps (i.e., "trap-mediated"), or defects, in the resistive switching layer when the device is reverse biased. The resistive switching layer, which is disposed in the ReRAM cell, will generally have at least two bi-stable resistive states, i.e., LRS and HRS. It is believed that the defects or traps, which are commonly formed during the deposition or initial burn-in or forming of the resistive switching layer, are often created by a non-stoichiometric material composition found in the formed resistive switching layer. $V_{SET}$ and $V_{RESET}$ are generally referred to as "switching voltages" herein.

The LRS of the ReRAM cell can be sensed using the read and write circuitry. When a read voltage $V_{READ}$ is applied to resistive switching ReRAM cell, the read and write circuitry will sense the relatively high "on" current value ($I_{ON}$), indicating that ReRAM cell is in its LRS. When it is desired to change the logic state, the resistive switching layer can once again be placed in its HRS by applying a positive "reset" voltage $V_{RESET}$ (e.g., +1 V to +5 V) to cell. When the "reset" voltage $V_{RESET}$ is removed from the cell, the cell can once again be characterized by its high resistance when the read voltage $V_{READ}$ is applied. Voltage pulses can be used in the programming of the ReRAM cell. For example, a 1 microseconds to 1 nanoseconds square or trapezoidal shaped pulse can be used to switch the cell. In some embodiments, it may be desirable to adjust the length of the pulse depending on the amount of time needed to switch the cell. In one example, the "set" and "reset" pulses are each about 10 ns in length. While the discussion of the ReRAM cell herein primarily provides bipolar switching examples, some embodiments of the ReRAM cell may use unipolar switching, where the "set" and "reset" voltages have the same polarity, without deviating from the scope of the invention described herein.

To provide a measurable difference between the logic "zero" and logic "one" states, it is common to form the resistive switching layer such that the $I_{ON}$ and $I_{OFF}$ currents have a difference of at least five times (e.g., current ratio $I_{ON}/I_{OFF} \geq 5$). In some examples, the difference between the logic "zero" and logic "one" states is at least one order of magnitude (e.g., current ratio $I_{ON}/I_{OFF} \geq 10$). In other words, the ratio of the electrical resistances of the resistive switching layer is decreased by at least a factor of 5 to 10 when switching from the high to the low resistance state.

Fabrication of a ReRAM cell may involve applying a forming voltage $V_{FORM}$ at least once through the cell in order to "burn-in" the cell. It is believed that the application of a forming voltage, which is typically significantly greater than the reset $V_{RESET}$ and set $V_{SET}$ voltages, causes formation and/or redistribution of the defects within the resistive switching layer. Specifically, the defects can move, align and/or collect within various regions of the resistive switching layer, causing the resistive switching layer to consistently and reliably switch between the LRS and HRS throughout the memory element's life. In some embodiments, the forming voltage $V_{FORM}$ is between about 1 and about 5 times greater than the reset $V_{RESET}$ or set $V_{SET}$ voltage. Specifically, the forming voltage $V_{FORM}$ may be between about 1.4 and about 2.5 times greater than the reset $V_{RESET}$ or set $V_{SET}$ voltage. In some embodiments, the forming voltage $V_{FORM}$ is between about 3 and about 7 volts. In some embodiments, a ReRAM cell may be fabricated in such a way that the application of a forming voltage is not required at all to assure that the cell performs as desired throughout its life.

Figure 3:
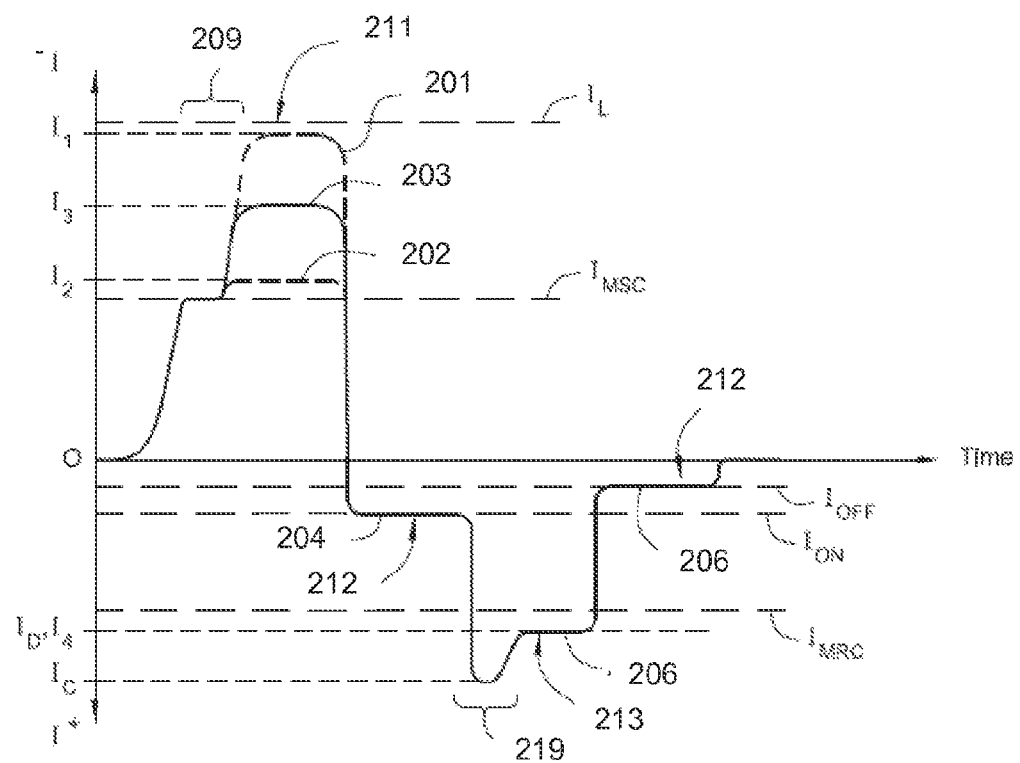
FIG. 3 is a current versus time plot illustrating the effect of delivering bipolar type switching pulses through a memory element, in accordance with some embodiments.

FIG. 3 is a plot of current versus time for a plurality of bipolar type "set" and "reset" switching pulses, as illustrated by pulses 201-206, that are delivered to a ReRAM cell in accordance with some embodiments. In one example, as shown in FIG. 3, a cell programming step may include the delivery of a "set" switching pulse 211, a "reset" switching pulse 213, and two "sensing" pulses 212. To assure that the ReRAM cell reliably switches from its HRS to its LRS and vice versa, one must assure that the "set" switching pulse 211 produces a current that is greater than a minimum "set" current $I_{MSC}$, which is defined as the minimum current required to flow through the resistive switching layer to cause it to switch from a high resistance state (e.g., 2.5 MΩ) to a low resistance state (e.g., <<250 kΩ). In some embodiments, the HRS and LRS of a resistive switching layer may be about 2.5 MΩ and about 100 kΩ, respectively.

Similarly, to assure that the ReRAM cell reliably switches from its LRS to its HRS the "reset" switching pulse 213 will generally be delivered at a current level that is greater than a minimum "reset" current $I_{MRC}$, which is defined as the minimum current required to flow through the resistive switching layer to cause it to switch from a low resistance state to a high resistance state. It should be noted that the minimum "set" current $I_{MSC}$ and minimum "reset" current $I_{MRC}$ are related to the physical and/or electrical properties of the material in a resistive switching layer, and thus may be adjusted by careful selection of the material(s) and/or physical properties (e.g., thickness) of the resistive switching layer and by performing various post-processing steps on the formed layer. In some examples, by controlling the number of defects in the formed the resistive switching layer, such as by adjusting the stoichiometry of the material(s) found in the resistive switching layer (e.g., $HfO_{1.7}$ vs. $HfO_2$) during the layer formation process, the minimum switching currents can be adjusted.

Figure 2:
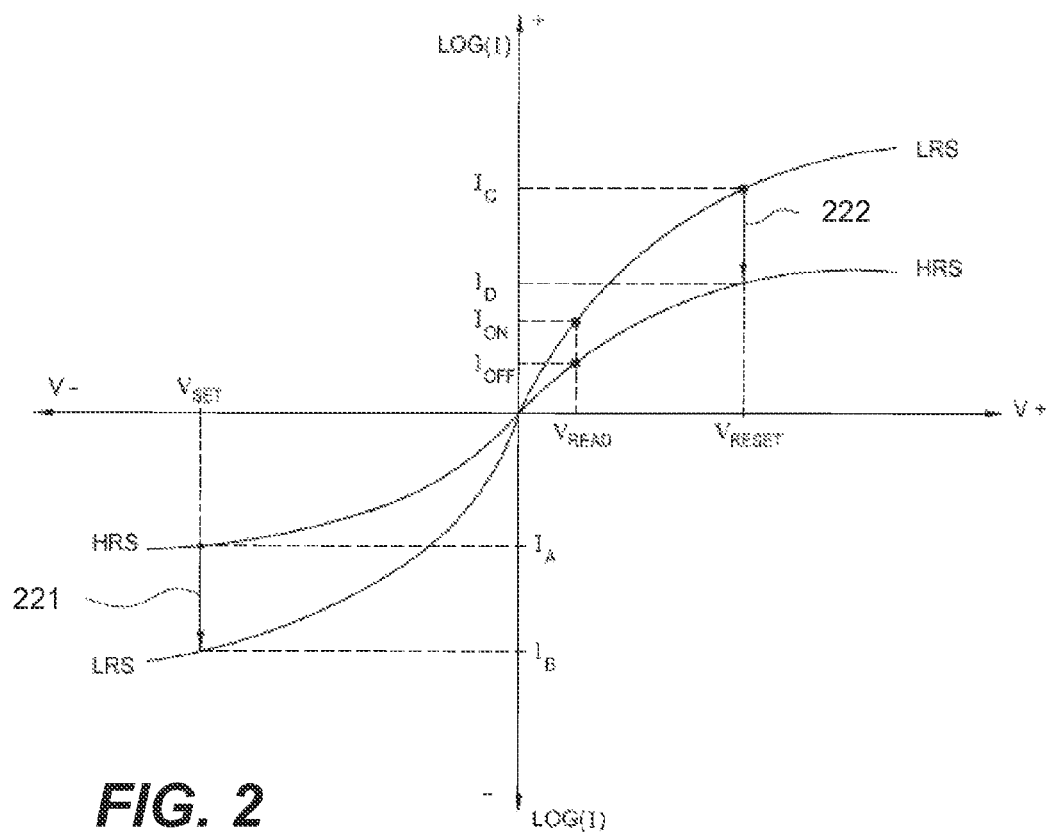
FIG. 2 is a graph illustrating the current versus voltage characteristics of the high and low resistance I-V curves of a resistive switching layer, in accordance with some embodiments.

Referring to FIGS. 2 and 3, in some examples, when a "set" switching pulse 211 is delivered to the ReRAM cell, the cell switches from its HRS to its LRS as shown by arrow 221. One will note that the current flowing through the ReRAM cell will shift from the initial "set" current $I_A$ to the final "set" current $I_B$ during the "set" operation, due to the change in resistance of the resistive switching layer. One will note that the initial "set" current $I_A$ will typically equal the minimum "set" current $I_{MSC}$, which was discussed above.

Alternately, when a "reset" switching pulse 213 is delivered to the ReRAM cell, the cell switches from its LRS to its HRS as shown by the arrow 222. One will note that the current flowing through the ReRAM cell will shift from the initial "reset" current $I_C$ to the final "reset" current $I_D$ during the "reset" operation, due to the change in resistance of the resistive switching layer.

Referring to FIG. 3, in some examples, a "set" switching pulse 211 is delivered to the ReRAM cell to create a LRS (e.g., or logic "one" state). In this case, a "set" voltage $V_{SET}$ is applied across the electrode layers, which creates a first "set" current $I_1$ to flow through the cell, due to the impedance of the electrical components found in the cell. The first "set" current $I_1$ is equal to the applied "set" voltage $V_{SET}$ divided by the sum of the impedances of the cell.

It is understood that the most damage to the components of the ReRAM cell occurs when a large current is delivered through the cell. Pulse 211 schematically illustrated in FIG. 3 focuses on the later stages of the "set" operation. The first "set" current $I_1$ achieved during the later stages of the "set" switching pulse 211 will generally equal the final "set" current $I_B$. In general, the first "set" current $I_1$ will vary during the time that the "set" pulse 211 is applied to the cell. The first "set" current $I_1$ may have low current region 209 that is created due to the electrical properties of the material as it switches from the HRS to the LRS. The "set pulse 211 may also have the final "set" current region as discussed above.

The resistance of the electrode layers is generally small to reduce power generation within the cell and/or array. The resistance of the resistance switching layer is desirably low at the end of the "set" operation (e.g., $I_1=I_B$), i.e., when the layer is in its LRS. When a current steering element (e.g., a diode) is provided in the cell, its resistance will dominate in the cell. In other words, the resistance of the cell is approximately equal to the resistance of the current steering element. As such, the magnitude of the "set" current $I_1$ created by the switching pulse 201 may be equal to the maximum current, or load current $I_L$ (FIG. 3), which is approximately equal to the "set" voltage divided by the impedance of the current steering element. One will note that the difference between the "set" current $I_1$ and the minimum $I_{MSC}$ current is much larger than necessary to cause the device to reliably switch to the logic "one" state. However, in practice it has been found that the high currents delivered through the cell can permanently damage the memory element components and cause crosstalk to occur between adjacently connected devices. One will note that the magnitude of the "set" current is particularly important for bipolar switching applications that require the current steering element to be reverse biased to "set" the resistance of the memory element into a low resistance state. In this case, the act of driving a high current through the current steering element, in a non-forward direction, can breakdown, generate heat within and ultimately damage the current steering element.

It has been found that, if the current steering element provides the primary voltage drop in the cell during the "set" operation as described above, the current steering element often is required to operate near its breakdown voltage to reliably cause the resistive switching layer to switch. Eventually, the current steering element may damage (i.e., breakdown), which will cause its impedance to drop. For example, the resistance of an undamaged reverse biased diode type current steering element may be in a range of about 1 and 100 mega-ohms, while the resistance of a forward biased diode type current steering element may be between about 1 and about 20 kilo-ohms.

Therefore, after performing the "set" operation by applying the "set" switching pulse 211, it is common to apply a "sensing" pulse 212 to assure that the logic "one" state has been achieved and the cell is still not damaged. The application of sensing pulse 212 is generally performed by applying a $V_{READ}$ voltage across the cell. If the "set" operation was performed correctly, the current through the cell during this sensing operation will be equal to the $I_{ON}$ current (which is equal to the $V_{READ}$ voltage divided by the impedance of the cell). For a cell that has a resistive switching layer in its LRS, the $I_{ON}$ current will approximately be equal to the $V_{READ}$ voltage divided by the impedance of the current steering element.

Next, in cases where it is desirable to change the ReRAM cell from a low resistance state (i.e., logic "one" state) to a high resistance state (i.e., logic "zero" state) a "reset" switching pulse 213, such as "reset" switching pulse 205, is delivered to the ReRAM cell. One will note that the largest current that is delivered through the ReRAM cell during the "reset" operation will be achieved when the initial "reset" current $I_C$ flows through the device. The current flowing through the device during the "reset" operation will then tend to drop as the resistive switching layer switches from its LRS to its HRS. Therefore, pulse 213, which is schematically illustrated in FIG. 3, may have a high current portion 219 at the start of the delivered pulse 213 and a stable region that equals the "reset" current $I_4$ during the later stages of the "reset" operation. Therefore, the "reset" current $I_4$ achieved for most of the duration of the "reset" switching pulse 213 will equal the final "reset" current $I_D$ and the maximum current achieved during the pulse 213 will equal the initial "reset" current $I_C$. It has been found that the magnitude of the current required to switch the ReRAM cell to its HRS from its LRS depends on the magnitude of the current used to "set" the cell in its LRS. If a high "set" current, such as current $I_1$, is delivered to the ReRAM cell, then a higher "reset" current is required to achieve a desirable high resistance state. Stated another way, the difference between the initial "reset" current $I_C$, and/or the final "reset" current $I_D$, and the minimum "reset" current $I_{MRC}$ current needs to be larger than necessary to cause the device to switch from the "on" to the "off" state if the magnitude of the prior applied "set" current is too far from the minimum "set" current $I_{MSC}$. The larger than necessary swings in the current used to switch between the "on" and "off" states can damage the materials and components in the ReRAM cell, thus affecting the memory element's lifetime and reliability.

Next, after delivering the "reset" switching pulse 213 it is common to apply a "sensing" pulse 212 to assure that the logic "zero" state has been achieved. Sensing pulse 212 is generally performed by applying a $V_{READ}$ voltage (e.g., +0.5V) across the cell. If a "reset" operation was performed correctly, the current through the cell during this sensing step will equal the $I_{OFF}$ current, which for the ReRAM cell will equal to the $V_{READ}$ voltage divided by the sum of the current steering element resistance ($R_{CSD}$) and the resistance of the resistance switching layer.

Examples of ReRAM Cell Components

Figure 4:
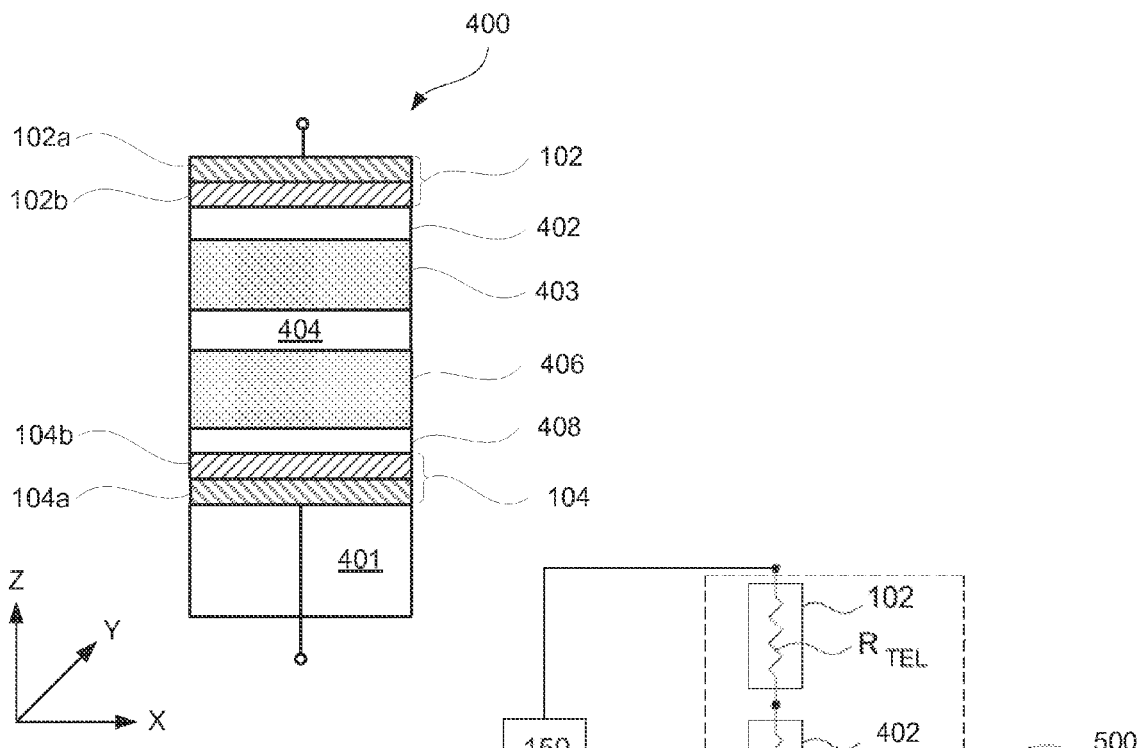
FIG. 4 is a schematic side cross-sectional view of a ReRAM cell, in accordance with some embodiments.

FIG. 4 is a schematic view of a ReRAM cell 400, in accordance with some embodiments. ReRAM cell 400 may include a substrate 401 and various layers formed over substrate 401, such as electrode layers 102 and 104, current steering element 408, current limiting layer 402, and resistive switching layer 404. A combination of these layers is sometimes referred to as a stack. In some embodiments, ReRAM cell 400 also includes one or more intermediate electrode layers 403 and 406 to form a specifically configured interface with resistive switching layer 404. In some embodiments, some of the illustrated components can be combined into a single component. For example, current limiting layer 402 may be used as an electrode layer that interfaces resistive switching layer 404 and/or as electrode layer that extends to other ReRAM cells as further described below. In some embodiments, ReRAM cell 400 includes a diffusion barrier layer disposed between current limiting layer 402 and resistive switching layer 404. The diffusion barrier layer may be formed from various diffusion barrier materials, such as TiSiN, TaSiN, and WSiN.

Electrode Examples

Electrode layers 102 and 104 may be used to provide external connections to cell 400 and may be operable as signal line interconnecting multiple ReRAM cells. In some embodiments, one or both electrodes may be replaced by current limiting layers that are operable as electrode layers. Such current limiting layers may have a much greater resistance in a direction normal to these layers (i.e., extending along the stack formed by different layers) than a resistance in a direction parallel to the layers, as further described below. Electrode layers 102 and 104 may form an interface with resistive switching layer 404. In some embodiments, additional layers are provided between one or more of electrode layers 102 and 104 and resistive switching layer 104. For example, current limiting layer 402, current steering element 408, and other components may be provided in between electrode layers 102 and 104.

In some embodiments, one or more of electrode layers 102 and 104 may include more than one sub-layer of conductive materials. For example, top electrode layer 102 may include a first top electrode sub-layer 102a and a second top electrode sub-layer 102b. Bottom electrode layer 104 may also include a first bottom electrode sub-layer 104a and a second bottom electrode sub-layer 104b. In this case, first electrode sub-layer 102a and/or first electrode sub-layer 104a (i.e., the external electrode sub-layers with respect to resistive switching layer 404) can be used to interconnect multiple ReRAM cells in the array, and thus may act as word-lines or bit-lines (or collectively, signal lines). Second electrode sub-layers 102b and 104b (i.e., the internal electrode sub-layers with respect to resistive switching layer 404) may each include a material that has desirable electrical properties (e.g., work function) so that these layers 102b and 104b can ensure resistive switching characteristics of ReRAM cell 400. First (external) electrode sub-layers 102a and/or 104a may be formed from tungsten (W), aluminum (Al) or copper (Cu). Second (internal) electrode sub-layers 102b and/or 104b may be formed from titanium (Ti), titanium nitride (TiN), or doped poly-silicon.

Those skilled in the art will understand that the configuration shown in FIG. 4 and discussed herein is not intended to be limiting as to the scope of the invention described herein, since, for example, each of electrode layers 102 and 104 may include only one conductive layer of the same composition. Overall, the position of the various layers, or number of layers, in the stack of layers used to form ReRAM cell may be altered without deviating from the scope of the invention described herein.

Electrode layers 102, 403, 406, and 104 disposed in ReRAM cell 400 are generally formed from a conductive material that has a desirable conductivity and work function. In some embodiments, each of electrode layers 102, 403, 406, and/or 104 is formed from different materials, which may include, but are not limited to p-type polysilicon, n-type polysilicon, transition metals, transition metal alloys, transition metal nitrides, or transition metal carbides. In some embodiments, electrode layers 102 and/or 104 include a metal, metal alloy, metal nitride or metal carbide formed from one or more of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), or combinations thereof. In some embodiments, electrode layers 102 and/or 104 include a metal alloy, such as a titanium/aluminum alloy or a silicon-doped aluminum (AlSi). Electrode layers 102 and 104 may include a metal, such as a transition metal, transition metal alloy, transition metal carbide, or transition metal nitride (e.g., TiN). Intermediate electrode layers 403 and 406 may include a heavily doped semiconductor material, such as a heavily doped silicon material (e.g., n-type polysilicon material) that interfaces well with resistive switching layer 404 and/or current steering element 408. In some embodiments, intermediate electrode layers 403 and 406 include doped polysilicon. The thickness of intermediate electrode layers 403 and 406 may be between about 50 and about 500 Angstroms, while the thickness of electrode layers 102 and 104 may be between about 50 and 5000 Angstroms each.

Current Limiting Layer Examples

Current limiting layer 402 is configured to limit the current passing through the layers of ReRAM cell 400 and to improve the overall switching performance and lifetime. As such, current limiting layer 402 needs to have a substantial resistance in the direction normal to current limiting layer (i.e., in the direction along the height of the stack or the Z direction illustrated in FIG. 4). In some embodiments, the resistivity of one or more materials used to form current limiting layer 402 in this direction is at least about 1 Ohm-cm or, more specifically, at least about 5 Ohm-cm and even at least about 10 Ohm-cm. For purposes of this disclosure, this resistance may be referred to as a vertical resistivity.

The resistivity of one or more materials used to form current limiting layer 402 in other directions (e.g., parallel to current limiting layer 402 or within the plane of current limiting layer 402, the X-Y plane as illustrated in FIG. 4) may be different or, more specifically, substantially less than the vertical resistivity. For purposes of this disclosure, a resistance within the X-Y plane may be referred to as a horizontal resistivity. In some embodiments, the horizontal resistivity of current limiting layer 402 is less than about $10^{-3}$ Ohm-cm or even less than about $10^{-5}$ Ohm-cm. As such, in some embodiments, current limiting layer 402 may have a ratio of its vertical resistivity to its horizontal resistivity to be at least about 1,000 or, more specifically, at least about 10,000 and even at least about 100,000. Some examples of materials that have different vertical and horizontal resistivities include HfN, NiCr, Al—NiCr, SiCr, SiCrO, SiCr(W)N, TiSiC, TaSiC, TiAlN, and TaAlN. The difference between vertical and horizontal resistivities may be impacted by deposition techniques used to form current limiting layer 402. In some embodiments, current limiting layer 402 is formed using physical vapor deposition (PVD), e.g., a hafnium nitride layer may be formed by sputtering hafnium target in a nitride environment.

The difference between vertical and horizontal resistivities is attributed to different conduction mechanisms. Specifically, horizontal conduction, which may be also referred to as lateral conduction, may be attributed to surface conduction as a dominant factor. As such, materials with many different surface states will exhibit low resistivity. On the other hand, vertical conduction may occur through grain boundaries. As such, amorphous layers may have a higher resistivity than corresponding crystalline layers. Current limiting layers with sufficiently low horizontal resistivities may be used as electrode layers that extend to other ReRAM cells and function as signal lines.

One or both types of resistivities of current limiting layer 402 may remain substantially unchanged upon applying substantial electrical fields to the layer. In some embodiments, the resistivity of the current limiting layer changes by less than 10% upon applying an electrical field of 1 MV/cm. In some embodiments, a breakdown voltage of a material used for current limiting layer 402 is greater than the breakdown voltage of the material forming resistive switching layer 404. The lower breakdown voltage may cause damage to the ReRAM cell as discussed herein. In some embodiments, the breakdown voltage of the materials forming current limiting layer 402 is at least about 8 V or, more specifically, at least about 12V. These stability characteristics apply mostly to the vertical resistivities of current limiting layers. However, in some embodiments, horizontal resistivities also meet one or more stability characteristics listed above.

Current limiting layer 402 may be disposed within ReRAM cell 400 close to resistive switching layer 404 and/or current steering element 408 to effectively limit and/or prevent propagation of the programming current pulses (e.g., "set" or "reset" pulses) through ReRAM cell 400. In some embodiments, current limiting layer 402 interfaces directly with resistive switching layer 404. Some examples of materials that may be used for such current limiting layers include TiAlN, TaAlN, TiSiC, and TaSiC. Some Cr-doped materials may be used as well. Even if current limiting layer 402 does not directly interface with resistive switching layer 404, the separation between current limiting layer 402 and resistive switching layer 404 may be less than about 400 Angstroms or, more specifically, less than about 200 Angstroms or even less than about 100 Angstroms. This close proximity of current limiting layer 402 and resistive switching layer 404 and/or current steering element 408 is particularly useful in ReRAM cells 400 that utilize high speed transient programming pulses, such as square or trapezoidal shaped pulses that are less than about 1 microsecond in length.

It is believed that further separating a current limiter from the resistive switching layer, such as using an externally provided current limiter that is not embedded into a ReRAM cell, does not effectively prevent the delivered high speed programming pulse energy from causing damage to the materials in resistive switching layer 404 and/or current steering element 408. Resistive switching layer 404 and/or current steering element 408 may break down when the high speed transient programming pulses are delivered through ReRAM cell 400, in particular when large currents are allowed to pulse through these components. It is believed that the propagation delay created during the transmission of the high speed programming pulse generally prevents the externally positioned current limiter from effectively reducing or dropping the instantaneous amount of energy passing through other components, such as resistive switching layer 404 and current steering element 408.

Current limiting layer 402 is formed from a suitable material that can be reliably and consistently formed and operated within ReRAM cell 400 as described elsewhere in this document. In some embodiments, a material of current limiting layer 402 has a suitable work function for controlling the electron flow between current limiting layer 402 and resistive switching layer 404. In some embodiments, current limiting layer 402 is used to change the formed barrier height at the interface with resistive switching layer 404. This feature is used to improve current flowing characteristics and reduce the magnitude of the switching currents. It should be noted that these changes in the barrier height will generally not affect the ratio of switching currents ($I_{ON}/I_{OFF}$) and, thus, will not impact detectability of different resistive states.

Composition, morphology, thickness, and other characteristics of current limiting layer 402 may be controlled to achieve desirable electrical and/or physical properties. For example, the resistance of current limiting layer 402 may be matched to the resistance of current steering element 408. The resistance control in current limiting layers is generally achieved by adjusting the thickness of the layer and selecting materials with specific resistivities. In some embodiments, the current limiting layer is formed such that its resistance ($R_{RL}$), which depends on the resistivity of the materials, thickness of the layer, and cross-sectional area of the layer, is between about 10 kilo-Ohm and about 10 mega-Ohm, such as between about 100 kilo-Ohm and about 1 mega-Ohm or, more specifically, between about 150 kilo-Ohm and about 500 kilo-Ohm. The resistivity of one or more materials used to form current limiting layer 402 in this direction is at least about 1 Ohm-cm or, more specifically, at least about 5 Ohm-cm and even at least about 10 Ohm-cm as noted above. For purposes of this disclosure, this resistance may be referred to as a vertical resistivity. In some embodiments, current limiting layer 402 is formed from amorphous materials.

Resistivity is an intrinsic property of the material and can be controlled by adjusting the composition of the material. Some specific examples include chromium containing materials, such as NiCr, Al—NiCr, SiCr, SiCrO, SiCr(W)N, transition metals combined with Group IV and/or Group VI elements, such as TiSiC and TaSiC, transition metals combined with Group III and Group V elements, such as TiAlN and TaAlN. Different compositions can be achieved by co-sputtering a single pre-composite target with a controlled element ratio in the target, or ALD nano-lamination by controlling the ratio of number of layers of, for example, TiN or AlN. Considering TiAlN as an example, it was found that resistivity will increase with concentration of nitrogen. When sputtering Ti and/or Al in nitrogen environment, the change in nitrogen concentration from 2% by volume in the nitrogen and argon mixture to about 20%-40% causes a more than ten-fold increase in resistivity of the resulting film. The resistivity may be also changed by changing the titanium-to-aluminum ratio in the deposited film. In general, increasing the titanium-to-aluminum ratio decreases resistivity. For example, $Ti_5AlN$ film has a resistivity in range of 3 milli-Ohm-cm, while $Ti_4AlN$, $Ti_3AlN$, TiAlN, $TiAl_2N$, and $TiAl_3N$ compositions have much higher resistivities. In the case of TaSiC and TiSiC, reduction in metal concentration and increase in silicon concentration increased resistance and vice versa. Furthermore, the carbon concentration in the resulting film is a strong factor impacting the concentration, i.e., additional carbon actually increases the resistivity of the resulting film. In the case of chromium, such as SiCrN, lower chromium concentration and higher silicon concentration increases the resistivity. Nitrogen concentration can be also adjusted to increase or decrease resistivity.

It has been found that SiCr alloys can achieve a resistivity of greater than 1 Ohm-cm, often greater than 10 Ohm-cm. Furthermore, such alloys are thermally stable and can easily withstand activation anneals of 600° C. and even 750° C., which is usually a challenge for some other materials. The resistivity of SiCr alloys can be adjusted by varying composition of silicon in these alloys and controlling oxygen partial pressure during deposition of the alloys. For example, a SiCr film containing some oxygen may be deposited using multi-target sputtering of a chromium target (e.g., purity 99.99 atomic %) and a silicon monoxide target (e.g., purity of 99.99 atomic %) in a constant flowing argon environment. The pressure may be maintained at about 0.6 Pa. The atomic concentration ratio of chromium to silicon in the resulting film may be between about 3 to 5/3 depending on the relative deposition rates that are used. The oxygen in the deposited film may come from the SiO target. The resulting film is sufficiently conductive even though it contains some oxygen in it, which is typically associated with dielectric and insulators.

Resistivity of chromium containing materials for current limiting layers may be controlled by adding nitrogen. Specifically, adding nitrogen into Cr—Si layers increases their resistivity. For example, a Cr—Si layer that is substantially free of nitrogen has a resistivity of 600 micro-Ohm-cm, while adding 15% atomic percent of nitrogen into the film increases its resistivity to 20 milli-Ohm-cm. Furthermore, addition of nitrogen increases thermal stability of some chromium containing materials up to 1300° C. Specifically, adding nitrogen increases the crystallinity temperature of the film such that the film will stay less crystallized at higher thermal anneal temperatures.

Chromium containing materials for current limiting layers may also include nickel, aluminum, and/or silicon. Alloys containing three or more such materials are believed to be more thermally stable than, for example, two-component alloys, such as Ni—Cr or Si—Cr. The resistivity of multi-component materials can be specifically tuned by adjusting the composition of each component. In some embodiments, Ni and/or Al is added into Cr—Si alloys to tune the resistance of these alloys. For example, the sheet resistance of a nickel-chrome alloy film containing 20 weight % of chromium can be as high as 2-3 kilo-Ohms, while being very stable. Another consideration is reliability of the materials, such as maintaining their properties during and after thermal cycling, humidity exposure, conversion reflow, and application of soldering heat. In general, reliability of Cr—Si alloys improves by adding Ni and/or Al.

The thickness of current limiting layer 402 may be less than about 200 Angstroms or, more specifically, less than about 100 Angstroms or even less than 50 Angstroms. Thinner current limiting layers may be desirable from a scaling perspective but properties of the materials may be difficult to control at the necessary level for such thin layers. Such thin current limiting layers may be formed using various deposition techniques, such as physical vapor deposition (PVD), atomic layer deposition (ALD), and chemical vapor deposition (CVD) as further described below.

Resistive Switching Layer Examples

Resistive switching layer 404 may be formed from a dielectric material, such as a metal oxide material or other similar material. This material can be switched between at least two or more stable resistive states. In some embodiments, resistive switching layer 404 is a high bandgap material (e.g., bandgap>4 electron volts (eVs)), such as hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). It has been found that using high band gap resistive switching layer materials may improve data retention in a ReRAM cell, and reduce the leakage current in the formed memory element device, since the amount of trapped charge in the resistive switching layer material will be less than a lower band gap material, and the high band gap materials create a large barrier height that the carriers have to cross during the read, "set" and "reset" operations. In other embodiments, lower bandgap metal oxide materials can be used, such as titanium oxide ($TiO_x$), nickel oxide ($NiO_x$) or cerium oxide ($CeO_x$) may be advantageous for some embodiments. In some cases, a semiconductor metal oxide (p-type or n-type) such as zinc oxides ($Zn_xO_y$), copper oxides ($Cu_xO_y$), and their nonstoichiometric and doped variants can be used. Resistive switching layer 404 may have a thickness of between about 10 and about 100 Angstroms. In some embodiments, resistive switching layer 404 is doped with a material that has an affinity for oxygen (e.g., transition metals (Al, Ti, Zr)) to form a metal-rich resistive switching layer (e.g., $HfO_{1.7}$ vs. $HfO_2$), which is deficient in oxygen, and thus has a larger number of oxygen vacancy-type defects. The additional vacancy defects can reduce the required switching and forming voltages, reduce the device operating current(s), and reduce the device to device variation in a formed memory element. In some embodiments, resistive switching layer 404 includes a metal oxide layer, such as $Hf_xO_y$, $Ta_xO_y$, $Al_xO_y$, $La_xO_y$, $Y_xO_y$, $Dy_xO_y$, $Yb_xO_y$, and/or $Zr_xO_y$, formed to a thickness of between about 20 and about 100 Angstroms, such as between about 30 and about 50 Angstroms. Resistive switching layer 404 can be deposited using any desired technique, but in some embodiments described herein is deposited using an atomic layer deposition (ALD) process. In other embodiments, resistive switching layer 404 can be deposited using a chemical vapor deposition (CVD) (e.g., low pressure CVD, plasma enhanced CVD) or ALD (e.g., plasma enhanced ALD), physical vapor deposition (PVD), liquid deposition processes, and epitaxy processes. It is believed that PEALD processes can be used to control defects and improve switching and forming voltages in some embodiments. In one example, an ALD process using tetrakis(dimethylamino) hafnium (TDMAH) and an oxygen containing precursor at a temperature of about 250° C. is used to form a 50 Angstroms thick hafnium oxide ($Hf_xO_y$) containing resistive switching layer 404.

Current Steering Element Examples

ReRAM cell 400 may also include current steering element 408. In some embodiments, current steering element 408 includes a p-n junction diode, p-i-n diode, transistor, or other similar device. Current steering element 408 may be disposed between electrode layer 102 and resistive switching layer 404 or some other components of cell 400. Current steering element 408 may include two or more layers of a semiconductor material, such as two or more doped silicon layers, that are configured to direct the flow of current through the device. In one example, the current steering element is a diode that includes a p-doped silicon layer (not shown), an un-doped intrinsic layer (not shown), and an n-doped silicon layer (not shown) that has an overall resistance between about 1 kilo-Ohm and about 100 mega-Ohms. The overall resistance will generally depend on the type of current steering element that is formed and in what direction current is flowing through the device (e.g., forward or reversed biased).

Resistance Considerations in ReRAM Cells

Figure 5:
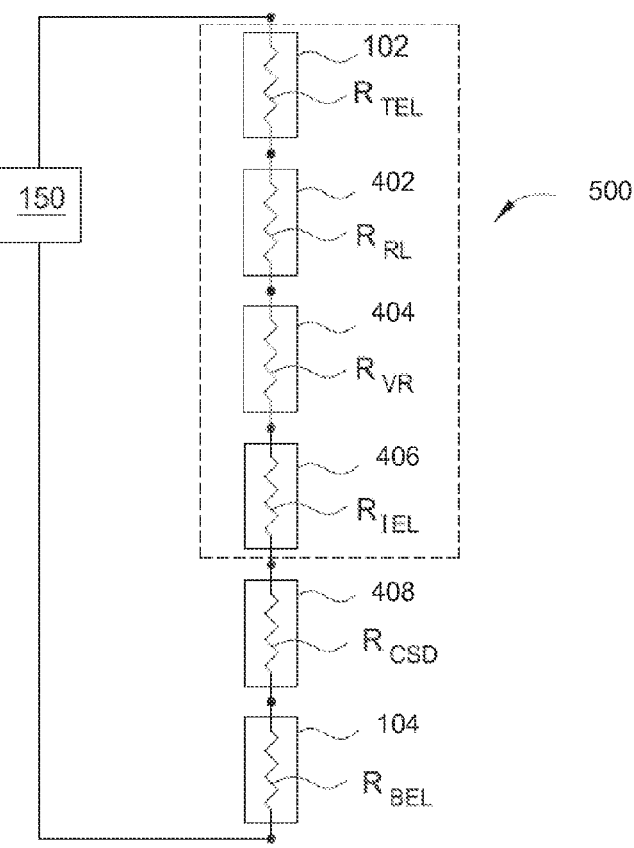
FIG. 5 is a schematic representation of an electrical circuit corresponding to the ReRAM cell illustrated in FIG. 5A, in accordance with some embodiments.

FIG. 5 schematically illustrates an electrical circuit 50 formed by ReRAM cell 400 shown in FIG. 4. As illustrated in FIG. 5, electrical circuit 500 includes a top electrode impedance (i.e., resistance $R_{TEL}$) created by top electrode layer 102 layer(s), a current limiting layer impedance (i.e., resistance $R_{RL}$) created by current limiting layer 402, a resistive switching layer impedance (i.e., resistance $R_{VR}$) created by resistive switching layer 404, an intermediate electrode impedance (i.e., resistance $R_{IEL}$) created by one or more intermediate electrode layers 403 and/or 406 (shown and described as a single element for simplicity), a current steering element impedance (i.e., resistance $R_{CSD}$) created by current steering element 408 and a bottom electrode impedance (i.e., resistance $R_{BEL}$) created by the bottom electrode layer 104 layer(s). It should be noted that impendences referred herein are impedances in the direction of the stack height (i.e., the vertical direction or the Z direction illustrated in FIG. 4). These impedances proportional to the thicknesses of the corresponding layers, which generally should be small to reduce the overall thickness of the stack.

Referring back to FIG. 3, in one example, a "set" switching pulse 211, or "set" pulse 203, is delivered through the ReRAM cell to create a low resistance state, or logic "one" state. In this configuration, a "set" voltage $V_{SET}$ is applied across the electrode layers and, which creates a "set" current $I_3$ to flow through the ReRAM cell, due to the impedance of the components in the ReRAM cell. "Set" switching pulse 211 will generate a "set" current $I_3$ during the later stages of the "set" operation as the resistive switching layer changes from the HRS to the LRS. The "set" current $I_3$ will equal the $V_{SET}$ voltage divided by the sum of the impedances in the ReRAM cell.

In some embodiments, the impedance of the electrodes is low, for example, to reduce the power loss during current transmission between ReRAM cells. The impedance of the variable current limiting layer is generally low (at least in its LRS) as well to reduce power losses in the ReRAM cell. As such, the impedance of the current steering element and/or the current limiting layer typically dominates the circuit. The impedance of the circuit in this state may be effectively equal to the sum of the impedances of the current steering element and the current limiting layer (i.e., $R_{RL}+R_{CSD}$). Therefore, the magnitude of the "set" current $I_3$ created by "set" pulse 203 can be adjusted by the selection of a desired impedance value of the current limiting layer. One will note that due to the presence of the added impedance ($R_{RL}$) of the current limiting layer, the actual impedance ($R_{CSD}^*$) of the current steering element will generally be greater than the impedance of a current steering element disposed in a cell that does not have the current limiting layer. As such, the added voltage drop provided by current limiting layer will prevent the current steering element from being damaged by the application of the programming currents during normal operation. In a ReRAM cell without a current limiting layer, the current steering element may often be operated near its breakdown voltage to reliably cause the resistive switching layer to switch as described above. This is generally not the case in the cell with the current limiting layer having a sufficient resistance due to the added voltage drop provided by this layer. The current limiting layer reduces the voltage applied across current steering element and, thus, prevents the impedance of the current steering element from dropping.

Figure 6:
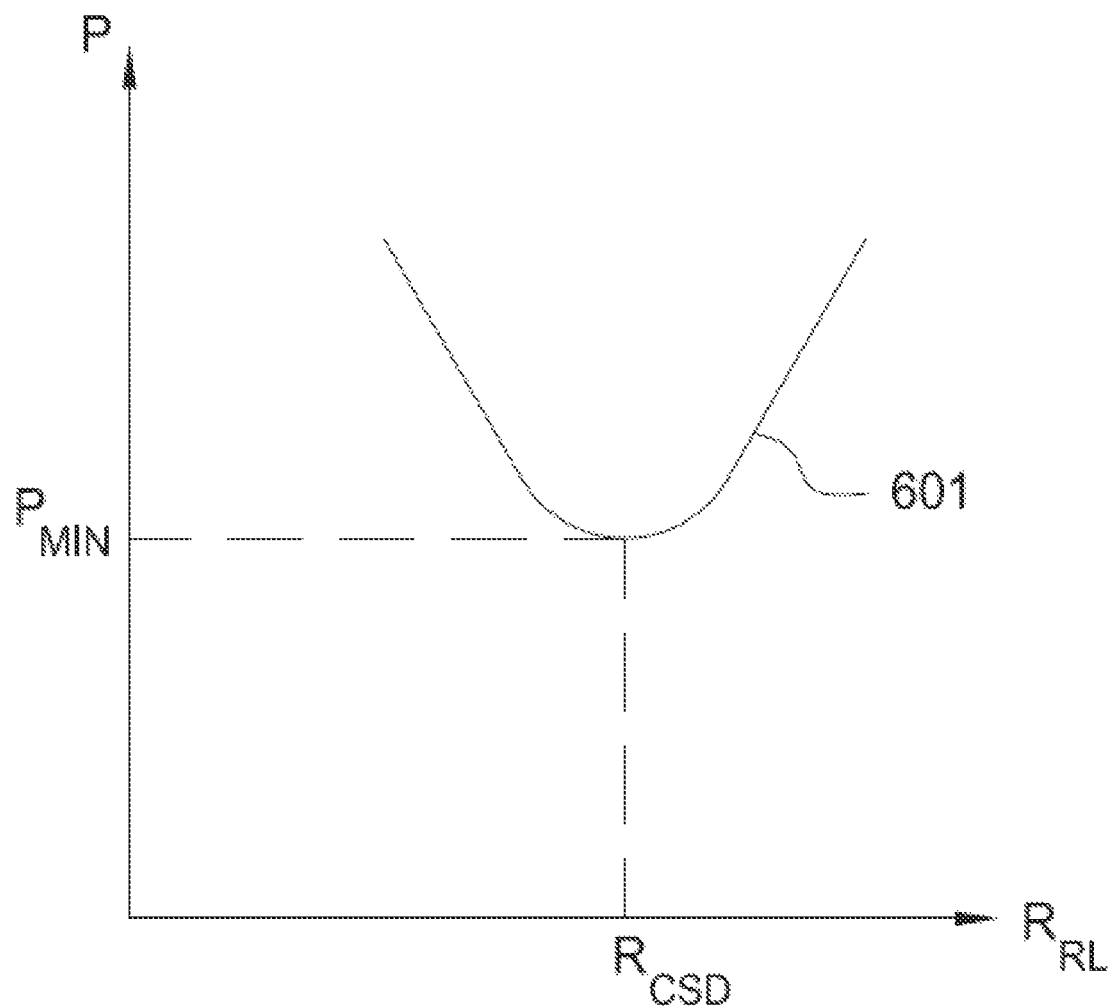
FIG. 6 is a graph illustrating power loss versus the magnitude of the current limiting layer resistance when a switching or sensing current is delivered through the current limiting layer, in accordance with some embodiments.

The impedance of a ReRAM cell containing a current limiting layer has to be optimized in order to reduce the power loss. FIG. 6 is a graph illustrating a plot of power loss (P) versus the magnitude of the current limiting layer impedance ($R_{RL}$) represented by trace 601. This power loss is created by passing a current through the current limiting layer. One will note that the power loss through the current limiting layer is equal to the square of the current (I) times the current limiting layer impedance ($R_{RL}$), or $P=I^2R_{RL}$. The current (I) through the ReRAM cell is equal to the applied voltage (V) across the electrode layers divided by the sum of the impedances in the circuit: $I=V/(R_{TEL}+R_{RL}+R_{VR}+R_{IEL}+R_{CSD}+R_{BEL})$. However, if it is assumed that resistive switching layer 404 is in its low resistance state and that the electrode impedances (e.g., $R_{TEL}$, $R_{IEL}$, $R_{BEL}$) are negligible as compared to the impedance of the current steering element impedance ($R_{CSD}$) and the current limiting layer ($R_{RL}$), the power loss (P) through the current limiting layer can be expressed as follows.

$$P=I^2R_{RL}=(V^2/(R_{RL}+R_{CSD})^2)R_{RL}=V^2/((R_{CSD}^2/R_{RL})+R_{RL}+2R_{CSD})$$

One will note that the power loss has an inflection point at which the power loss and current are at a minimum. This point represents the case in which the current limiting layer's resistance is equal to the current steering element's impedance (e.g., $R_{RL}=R_{CSD}$). Therefore, it may be desirable to form the current limiting layer, such that the magnitude of its impedance is substantially equal to the magnitude of the impedance of the current steering element impedance. One will note that in a more general case where the resistive switching layer impedance is not negligible relative to the current steering element impedance and the current limiting layer impedance, the inflection point will occur where the current limiting layer impedance is equal to the current steering element impedance plus resistive switching layer impedance at the LRS.

In order to improve switching characteristics of the resistive switching layer, the resistance of the current limiting layer is adjusted such that that the applied voltage (i.e., $V_{SET}$ or $V_{RESET}$) generates the current within the following range: between the maximum allowable current, or load current $I_L$, and the minimum current required to switch the device from one logic state to another (i.e., $I_{MSC}$ or $I_{MRC}$). In some embodiments, the current limiting layer impedance $R_{RL}$ is formed so that it has an impedance equal to a minimum "set" resistance ($R_{MSR}$) value, where the minimum "set" resistance ($R_{MSR}$) is equal to the minimum "set" voltage $V_{MSET}$ applied across the electrode layers divided by the minimum "set" current ($I_{MSC}$) flowing through the device minus the sum of all of the other series resistance in the cell, or $$R_{MSR}=R_{RL}=[(V_{MSET}/(I_{MSC}))-(R_{TEL}+R_{VR}+R_{IEL}+R_{CSD}+R_{BEL})],$$

where the minimum "set" voltage $V_{MSET}$ is the "set" voltage required to achieve the minimum "set" current ($I_{MSC}$) through the cell. Therefore, assuming the resistive switching layer resistance and the electrode resistances are much smaller than the current steering element impedance ($R_{CSD}$) when the resistive switching layer is in the low resistance state the minimum "set" resistance will approximately equal the following: $R_{MSR}=R_{RL}=(V_{MSET}/(I_{MSC}))-R_{CSD}$.

In general, it is desirable to assure that the current limiting layer impedance $R_{RL}$ is non-zero to prevent the current flowing through the cell from reaching the load current (IL). In one example, it is desirable to form the current limiting layer such that it has a resistance equal to an impedance that is between about 75% and about 125% of the impedance of the current steering element impedance ($R_{CSD}$). In one example, the current limiting layer impedance ($R_{RL}$) is between about 10 kΩ and about 10 MΩ, such as between about 100 kΩ and about 1 MΩ.

As the size of ReRAM cells shrink to improve device performance and storage capacity, the programming parameters that cause resistive switching layer 404 to switch also need to be adjusted. Typically, the programming parameters that need to be adjusted as device size is reduced include the applied switching current ($I_{switch}$) and voltage drop applied across the resistive switching layer. In general, a device's programming parameters are limited by the maximum applied voltage ($V_{MAV}$), which is usually defined for each type of device by industry standards and/or by a device manufacturer's device "product specification." In one example, the product specification for a 65 nm technology node non-volatile memory device has a maximum applied voltage ($V_{MAV}$) of about 8 Volts. To reliably cause a ReRAM cell to switch, it is believed that both the voltage drop applied across the resistive switching layer needs to be above a minimum switching voltage ($V_{MSV}$) and the current delivered through the resistive switching layer must be greater than the minimum switching current ($I_{MSWC}$). It is believed that the electric field created in resistive switching layer 404, due to the application of a voltage greater than the minimum switching voltage ($V_{MSV}$), and the application of a current greater than the minimum switching current ($I_{MSWC}$) will cause the movement and alignment in LRS or non-alignment in HRS of the vacancy type defects in the resistive switching layer, which causes the resistive switching layer to more reliably switch between the desirable LRS and HRS. It is also believed that the electric field created by the minimum switching voltage ($V_{MSV}$) and application of the minimum switching current ($I_{MSWC}$) are both required to assure that all of the devices in an array of formed ReRAM cells will all reliably switch. It is noted that by adjusting the material properties of the resistive switching layer (e.g., material composition, thickness, defect density, crystal structure) the switching characteristics of resistive switching layer 404 can be adjusted.

However, as noted above, the ability to provide a voltage drop across the resistive switching layer that exceeds the minimum switching voltage ($V_{MSV}$) and provide a current that exceeds the minimum switching current ($I_{MSWC}$) is limited by the maximum applied voltage ($V_{MAV}$). The voltage drops formed within the ReRAM cell when a maximum applied voltage ($V_{MAV}$) is applied, will equal the sum of the voltage drops across the cell, which can be defined as follows.

$$V_{MAV} = \Sigma \Delta V_i \approx \Delta V_{TEL} + \Delta V_{RL} + \Delta V_{VR} + \Delta V_{IEL} + \Delta V_{CSD} + \Delta V_{BEL}$$

Stated another way, the maximum applied voltage ($V_{MAV}$) will cause an applied current ($I_{MAV}$) to flow through the total resistance ($R_{Total}$) of the cell.

$$V_{MAV} = I_{MAV} \times R_{Total} = I_{MAV} \times \Sigma R_i; \text{ or}$$

$$V_{MAV} \approx I_{MAV} \times (R_{TEL} + R_{RL} + R_{VR} + R_{IEL} + R_{CSD} + R_{BEL})$$

If it is assumed that the electrode impedances (e.g., $R_{TEL}$, $R_{IEL}$, $R_{BEL}$) are negligible, as compared to the current limiting layer impedance ($R_{RL}$), the current steering element impedance ($R_{CSD}$) and the resistive switching layer impedance ($R_{VR}$) the equation (s) can be further simplified to the following: $V_{MAV} \approx I_{MAV} \times (R_{RL} + R_{VR} + R_{CSD}) = \Delta V_{RL} + \Delta V_{VR} + \Delta V_{CSD}$.

Therefore, if one assumes that the resistance of resistive switching layer 404 in either the high or the low resistance states remains relatively constant during the useable life of the device, and that the current limiting layer impedance is as large as possible (i.e., maximum resistance layer impedance ($R_{RL}^*$)), while still allowing the device to reliably switch, the generated applied current ($I_{MAV}$) will equal the minimum switching current ($I_{MSWC}$) and the load resistance will equal the following: $R_{RL}^* = (V_{MAV}/I_{MSWC}) - (R_{VR} + R_{CSD})$.

Where $R_{VR}$ is either in a high resistance state or in a low resistance state depending on whether the device is in LRS or HRS, the minimum switching current ($I_{MSWC}$) will vary depending on the type of operation being performed (e.g., switching between LRS and HRS) and the $R_{CSD}$ varies depending whether it is forward or reverse biased. If the resistance layer impedance ($R_{RL}$) exceeds the maximum resistance layer impedance ($R_{RL}^*$) the device will not reliably switch between operating states, and thus should be avoided.

In some embodiments, a ReRAM cell used for 65 nm technology node has a maximum applied voltage ($V_{MAV}$) of about 8 Volts. The maximum resistance of the current limiting layer ($R_{RL}^*$) may be less than about 590-600 kilo-Ohms, so that a minimum switching current of about 10 micro-Amperes can be generated during a "reset" operation. In the same type of device, the minimum switching current of about 610 nano-Amperes can be achieved during a "set" operation. One will note that in these examples, the resistive switching layer impedance ($R_{VR}$) in the LRS state may be about 200 kilo-Ohms, while its impedance in the HRS state may be about 2.5 mega-Ohms. In the same example, the current steering element impedance ($R_{CSD}$) in the forward direction may be about 10 kilo-Ohms and in the reverse direction may be about 10 mega-Ohms.

Referring to FIG. 3, in general, it is desirable to form current limiting layer 402 so that its impedance ($R_{RL}$) limits the current through a ReRAM cell to a value (e.g., current $I_2$) that is just greater the minimum "set" current $I_{MSC}$, as illustrated by pulse 202, and still allow the "on" logic state to be reliably "set" by the applied $V_{SET}$ voltage. It is believed that adding current limiting layer 402 to a ReRAM cell can also help reduce the apparent minimum $I_{MSC}$ current required to cause resistive switching layer 404 to change to a low resistive state, since the addition of the current limiting layer impedance ($R_{RL}$) in the circuit will reduce the swing in current between the "set" and "reset" switching currents at the same fixed applied voltage, thus affecting the density and movement of the traps in the resistive switching layer. Not intending to be bound by theory, it is believed that when a smaller switch current is applied to a device, the formed filament(s) or aligned traps will be smaller in size than if a higher switching current is applied, thus making the filament(s) easier to alter during the "reset" phase of the resistive switching process.

In some embodiments, a resistance of the current limiting layer ($R_{RL}$) is greater than the resistance of the current steering element ($R_{CSD}$). These configurations may prevent the "set" programming current from reaching the load current ($I_L$) when the maximum applied voltage ($V_{MAV}$) is applied. Furthermore, these configurations may allow the ReRAM cell to reliably switch during the "set" operation and/or to minimize the magnitude of the peak "reset" programming current (e.g., current $I_C$).

It should be noted that the minimum switching voltage $V_{MSV}$ and/or minimum switching current ($I_{MSWC}$) depend on whether the ReRAM cell is in LRS or HRS. The minimum switching voltage can be written as the following.

$$V_{MSV} = V_{MAV} - (I_{MSWC} \times (R_{RL} + R_{CSD}))$$

Since the switching characteristics of resistive switching layer 404 depend on its electrical and physical properties, tuning of the current limiter's resistance ($R_{RL}$) is important since it effectively limits the switching characteristics of resistive switching layers 404. Therefore, the current limiter's resistance ($R_{RL}$) may drive the type of resistive switching materials and/or switching layer properties that can be used in a reliable device.

In some embodiments, the current limiting layer is formed from a material that will not significantly vary in resistance when the "set" and "reset" switching voltages are applied to the cell. Forming the current limiting layer from a material that has a generally constant resistance assures that the switching characteristics of the ReRAM cell do not change over the life of the cell. Also, forming the current limiting layer from a material that does not significantly vary in resistance during the programming steps provide less variability in the electrical properties of the formed layer due to variations in the deposition process (e.g., defect density variations). It also provides less variability in the electrical properties of the formed layer over the lifetime of the ReRAM cell due to any physical or chemical change in the current limiting layer material. Furthermore, it allows a lower device performance variability that is created by differences in the "forming" process (i.e., application of the forming voltage ($V_{FORM}$)). In some embodiments, the current limiting layer has a single resistive state, since it does not significantly vary in resistance during the electrical "forming" and/or programming steps. The material and electrical properties of the current limiting layer do not degrade or breakdown during the electrical "forming" process, and also during normal repetitive operation of the ReRAM cell.

ReRAM Cell Fabrication Processes

Figure 7:
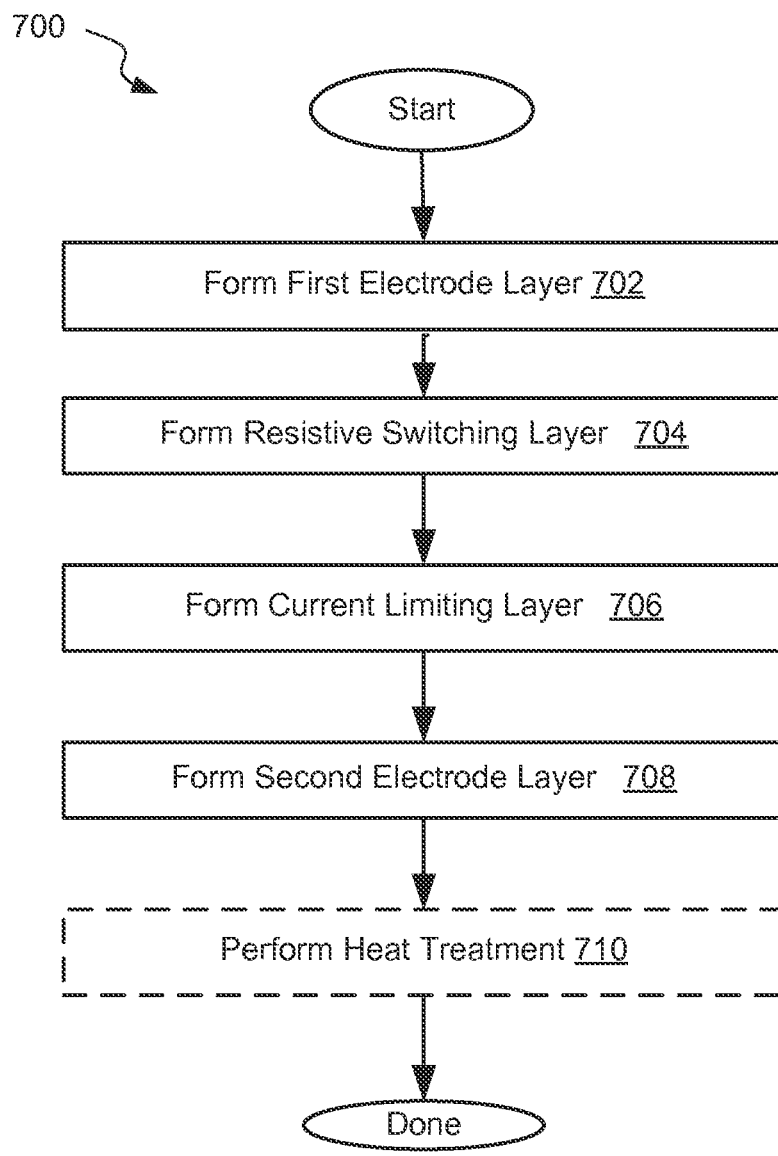
FIG. 7 is a process flowchart corresponding to a method of forming a ReRAM cell, in accordance with some embodiments.

FIG. 7 illustrates a process sequence 700 that can be used to form a ReRAM cell, in accordance with some embodiments. Sequence 700 may start with operation 702, during which a first electrode layer is formed. The first electrode layer may be bottom electrode layer 104 or intermediate electrode 406 (illustrated in FIG. 4 and described above). Operation 702 may also involve forming a current steering element. One or more of these components may be formed over a substrate, such as a silicon substrate. Physical vapor deposition (PVD), chemical vapor deposition (CVD), atomic layer deposition (ALD), or other techniques may be used for these purposes. In some embodiments, the empirical or theoretical resistance of the current steering element formed during this operation is determined based on its materials and methods of fabrication. In some embodiments, this information may be used to design a current limiting layer with a resistance that would correlate to the resistance of a current steering element as described above. In some embodiments, the current steering element is a diode that includes a p-doped silicon layer, an un-doped intrinsic layer, and an n-doped silicon layer. All three layers may be formed by CVD techniques. In some embodiments, the first electrode includes a titanium nitride layer or doped polysilicon layer that is between about 50 and 1,000 nanometers thick and is formed using a PVD technique or an ALD technique.

In some embodiments, an intermediate electrode layer including highly doped polysilicon may be formed using a CVD technique or an ALD technique. An optional native oxide layer removal operation may be performed after forming the intermediate electrode layer. For example, a wet chemical processing technique or a dry clean process may be performed.

Sequence 700 may proceed with forming a resistive switching layer during operation 704. However, in some embodiments, a current limiting layer is formed prior to forming a resistive switching layer. The resistive switching layer may be deposited over the first electrode layer, which may be an intermediate electrode (e.g., provided over a current steering element) or a bottom electrode layer. The resistive switching layer may be deposited using a PVD, CVD or ALD technique. The deposited resistive switching layer may include various metal oxides and other materials listed above.

In some embodiments, the resistive switching layer is deposited using an ALD technique. For example, a resistive switching layer including hafnium oxide may be formed as such. Tetrakis(dimethylamino)hafnium (TDMAH) may be used as a precursor, and is oxidized into hafnium oxide using an oxygen containing reagent (e.g., water vapor). The processing temperature may be about 250° C.

Sequence 700 may proceed with forming a current limiting layer during operation 706. The current limiting layer may be formed over the resistive switching layer or some other layer. Various examples and variations of the stack structure are described above with reference to FIG. 4. PVD, CVD, or ALD or other similar techniques may be used for depositing a current limiting layer. Some examples of these deposition methods are provided above.

Sequence 700 may proceed with forming a second electrode during operation 708. This second electrode may be formed over the current limiting layer, resistive switching layer, or some other layer depending on the configuration of the stack described above with reference to FIG. 4. Deposition of the second electrode may be performed using a process similar to the deposition of the first electrode described above with reference to operation 702.

During optional operation 710, ReRAM stack may be optionally annealed. Annealing may be performed at a temperature of at least about 550° C. or, more specifically, at a temperature of at least about 700° C. For example, the stack may be heated to between about 550° C. and 1000° C. for between about 30 seconds and 20 minutes Annealing operation 710 may be specifically tuned to form various interfaces between adjacent layers in the stack, such as between the current limiting layer and its adjacent layer. Annealing operation 710 may be also used to activate and/or further process other layers formed in the ReRAM cell.

In some embodiments, the current limiting layer is formed as part of or after formation of the second electrode during operation 708 by, for example, adjusting one or more process gas flows used in the CVD or ALD. As a result, two different layers may be formed in the same operation. Specifically, a current limiting layer may be formed at the beginning or at the end of electrode layer deposition process by reducing the amount or flow of a dopant precursor gas in the chamber to form a less doped layer that has a higher resistivity.

Conclusion

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method for forming a resistive random access memory cell, the method comprising:
   forming a resistive switching layer comprising a resistive switching material;
   forming a current limiting layer,
      the current limiting layer comprising one of chromium, titanium, or tantalum,
      the current limiting layer having a breakdown voltage of at least 8V and a resistivity of at least 1 Ohm-cm in a direction normal to the current limiting layer; and
   forming an electrode layer.

2. The method of claim 1, wherein forming the current limiting layer and forming the electrode layer are in a same operation.

3. The method of claim 2, wherein a flow of a dopant precursor gas is less when the current limiting layer is formed than when the electrode layer is formed.

4. The method of claim 1, further comprising annealing the resistive random access memory cell by heating at least the current limiting layer of the resistive random access memory cell to at least about 550° C.

5. The method of claim 1, further comprising forming a current steering element, wherein a resistance of the current steering element and a resistance of the current limiting layer is same.

6. The method of claim 1, wherein the current limiting layer comprises chromium.

7. The method of claim 6, wherein the current limiting layer comprises one of NiCr, AlNiCr, SiCr, SiCrO, or SiCrWN.

8. The method of claim 6, wherein a concentration of chromium in the current limiting layer is between about 25 and 75 atomic percent.

9. The method of claim 1, wherein the current limiting layer comprises titanium.

10. The method of claim 9, wherein the current limiting layer comprises one of TiSiC or TiAlN.

11. The method of claim 1, wherein the current limiting layer comprises tantalum.

12. The method of claim 11, wherein the current limiting layer comprises one of TaSiC or TaAlN.

13. The method of claim 1, wherein a resistivity of the current limiting layer in a direction parallel to the current limiting layer is less than the resistivity in the direction normal to the current limiting layer.

14. The method of claim 1, wherein the current limiting layer has a resistivity of less than 0.001 Ohm-cm in a direction parallel to the current limiting layer.

15. The method of claim 1, wherein the current limiting layer has a thickness of less than 200 Angstroms.

16. The method of claim 1, wherein the resistive switching material comprises one of hafnium oxide, aluminum oxide, tantalum oxide, zirconium oxide, or yttrium oxide.

17. The method of claim 1, wherein the electrode layer comprises one of doped polysilicon, titanium, titanium nitride, platinum, iridium, iridium oxide, ruthenium, or ruthenium oxide.

18. The method of claim 1, further comprising forming an additional electrode between the current limiting layer and the resistive switching layer.

19. The method of claim 1, further comprising forming a diffusion barrier layer between the current limiting layer and the resistive switching layer.

20. A method of forming a resistive random access memory cell, the method comprising:
   forming a first electrode layer comprising n-doped polysilicon;
   forming a second electrode layer comprising titanium nitride;
   forming a current limiting layer comprising nickel and chromium,
      wherein a concentration of chromium in the current limiting layer is between 25 and 75 atomic percent,
      the current limiting layer having a breakdown resistance of at least 8V and a resistivity of at least 1 Ohm-cm in a direction normal to the current limiting layer,
      the current limiting layer disposed between the first electrode layer and the second electrode layer and having a thickness of less than 100 Angstroms; and
   forming a resistive switching layer comprising hafnium oxide,
      the resistive switching layer disposed between the first electrode layer and the second electrode layer.

* * * * *